United States Patent
Deng

(10) Patent No.: US 12,291,776 B2
(45) Date of Patent: May 6, 2025

(54) FILM AND FORMING METHOD THEREOF

(71) Applicant: CHANGXIN MEMORY TECHNOLOGIES, INC., Hefei (CN)

(72) Inventor: Xinlian Deng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 115 days.

(21) Appl. No.: 18/150,258

(22) Filed: Jan. 5, 2023

(65) Prior Publication Data

US 2023/0142204 A1 May 11, 2023

Related U.S. Application Data

(63) Continuation of application No. PCT/CN2021/128070, filed on Nov. 2, 2021.

(30) Foreign Application Priority Data

Mar. 22, 2021 (CN) .......................... 202110304036.9

(51) Int. Cl.
- *C23C 16/27* (2006.01)
- *C23C 16/513* (2006.01)
- *C23C 16/56* (2006.01)

(52) U.S. Cl.
CPC .......... *C23C 16/276* (2013.01); *C23C 16/277* (2013.01); *C23C 16/513* (2013.01); *C23C 16/56* (2013.01)

(58) Field of Classification Search
CPC ............................ C23C 16/276; C23C 16/277
See application file for complete search history.

(56) References Cited

U.S. PATENT DOCUMENTS

| | | | |
|---|---|---|---|
| 6,660,340 B1 | 12/2003 | Kirkpatrick | |
| 2003/0026921 A1* | 2/2003 | Ueno | C23C 16/26 427/595 |
| 2008/0210950 A1* | 9/2008 | Sung | H01L 31/1884 257/E21.042 |
| 2012/0145918 A1* | 6/2012 | Radovanov | H01J 37/32357 250/424 |
| 2021/0407802 A1* | 12/2021 | Hsu | H01L 21/0337 |

FOREIGN PATENT DOCUMENTS

| | | | |
|---|---|---|---|
| CN | 107641788 A | * | 1/2018 |
| CN | 108411258 A | | 8/2018 |
| CN | 109972101 A | | 7/2019 |

(Continued)

OTHER PUBLICATIONS

JP2012107344, machine translation. (Year: 2012).*

(Continued)

*Primary Examiner* — Robert A Vetere
(74) *Attorney, Agent, or Firm* — Kilpatrick Townsend & Stockton LLP

(57) ABSTRACT

Embodiments of the present disclosure provide a film and a forming method thereof. The forming method includes: providing a base; forming a diamond-like carbon film on the base, where the DLC film has carbon-hydrogen chemical bonds; and performing photocatalytic treatment on the DLC film, to break at least some of the carbon-hydrogen chemical bonds and reduce content of hydrogen elements in the DLC film.

15 Claims, 3 Drawing Sheets

(56) References Cited

FOREIGN PATENT DOCUMENTS

| | | | |
|---|---|---|---|
| CN | 109898051 B | | 2/2020 |
| CN | 110965022 A | | 4/2020 |
| CN | 111729508 A | | 10/2020 |
| CN | 112490118 A | | 3/2021 |
| CN | 113066714 A | | 7/2021 |
| EP | 1257681 A1 | | 11/2002 |
| JP | 2012107344 A | * | 6/2012 |
| JP | 2015030859 A | | 2/2015 |
| WO | 0159172 A1 | | 8/2001 |

OTHER PUBLICATIONS

CN107641788, machine translation. (Year: 2018).*
International Search Report cited in PCT/CN2021/128070 mailed Jan. 27, 2022, 10 pages.
Zhang, et al. "Research Progress on the Photocatalytic Conversion of Methane and Methanol", www.whxb.pku.edu.cn, 2019, pp. 923-939 with English abstract.
Peng et al., "Effect of metal doping on structure and properties of diamond-like carbon films: a review", 2019, vol. 38, No. 15, 7 pages with English abstract.
Youzhi, et al., "Properties Modification of Diamond-Like-Carbon Films by Doping of Copper or Chromium", 2018, Chinese Journal of Vacuum Science and Technology, pp. 764-771 with English abstract.
Wang, et al., "Effects of Annealing Treatment on the Structure and Tribological Properties of Diamond-like Carbon Thin Films", Surface Technology, 2019, pp. 133-138 with English abstract.
Dai, Wei, Research on the Synthesis, Structure and Properties of Metal Doped Diamond-like Carbon Nanocomposite Films, 2015, pp. 128-131 with English abstract.
First Office Action cited in CN202110304036.9, mailed May 17, 2022, 10 pages.

* cited by examiner

FILM AND FORMING METHOD THEREOF

CROSS-REFERENCE TO RELATED APPLICATIONS

This is a continuation of International Application No. PCT/CN2021/128070, filed on Nov. 2, 2021, which claims the priority to Chinese Patent Application No. 202110304036.9, titled "FILM AND FORMING METHOD THEREOF" and filed on Mar. 22, 2021. The entire contents of International Application No. PCT/CN2021/128070 and Chinese Patent Application No. 202110304036.9 are incorporated herein by reference.

TECHNICAL FIELD

The present disclosure relates to, but is not limited to, a film and a forming method thereof.

BACKGROUND

A diamond-like carbon (DLC) film, as a metastable material generated by combining Sp3 hybrid bonds and Sp2 hybrid bonds, has the excellent characteristics of both diamond and graphite, and has relatively high hardness, high resistivity, a good optical property, and an excellent tribological property, and therefore is widely used in the semiconductor industry. Due to the relatively high hardness of the DLC film, in a semiconductor patterning process, the use of the DLC film can effectively reduce a thickness of a photoresist and avoid collapse caused by an excessively high photoresist.

However, the DLC film has a relatively high internal stress, which has serious impact on a transfer effect of a pattern and tends to cause warpage of a wafer.

SUMMARY

An overview of the subject matter detailed in the present disclosure is provided below, which is not intended to limit the protection scope of the claims.

Embodiments of the present disclosure provide a film and a forming method thereof.

According to a first aspect of the embodiments of the present disclosure, a method of forming a film is provided, including: providing a base; forming a DLC film on the base, where the DLC film has a carbon-hydrogen chemical bond; and performing photocatalytic treatment on the DLC film, to break at least some of the carbon-hydrogen chemical bonds and reduce content of hydrogen elements in the DLC film.

According to a second aspect of the embodiments of the present disclosure, a film is provided, including: a DLC film obtained after photocatalytic treatment, where content of carbon-hydrogen chemical bonds included in the DLC film accounts for less than 5% of all chemical bonds, the DLC film is doped with metal elements, and part of the DLC film is a first DLC film including group V elements.

Other aspects of the present disclosure are understandable upon reading and understanding of the accompanying drawings and detailed description.

BRIEF DESCRIPTION OF THE DRAWINGS

The accompanying drawings incorporated into the specification and constituting a is part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Because the DLC film has a large quantity of hydrogen elements, atomic arrangement in the DLC film is irregular, and the irregular atomic arrangement leads to low hardness of the DLC film. In addition, because the DLC film has a large quantity of Sp3 hybrid bonds, a density of carbon atoms in a partial region of the DLC film is relatively high, and an average coordination number of most atoms in the DLC film is relatively high, causing a relatively high internal stress of the DLC film. When the DLC film is used in a semiconductor patterning process, the DLC film with a relatively high internal stress has an adverse effect on a transfer effect of a pattern, and tends to cause warpage of a wafer.

An embodiment of the present disclosure provides a film and a forming method thereof, to perform photocatalytic treatment on the DLC film to remove some of hydrogen elements in the DLC film, and then perform ion implantation treatment on the DLC film to reduce content of Sp3 hybrid bonds in the DLC film, such that a density of carbon atoms in a partial region of the DLC film is reduced, thereby improving hardness of the DLC film and reducing an internal stress of the DLC film.

Figure 1:
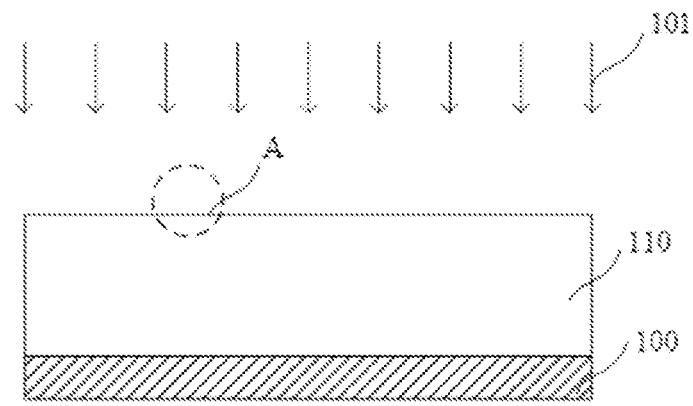
FIG. 1, FIG. 3, FIG. 5 and FIG. 7 are schematic diagrams of structures corresponding to various steps of a method of forming a film according to an embodiment of the present disclosure.

Referring to FIG. 1, a base 100 is provided, and a DLC film 110 is formed on the base 100.

The base 100 may be made of a material including monocrystalline silicon, silicon-on-insulator (SOI), stacked silicon-on-insulator (SSOI), stacked silicon-germanium-on-insulator (S-SiGeOI), silicon-germanium-on-insulator (Si-GePOI), and germanium-on-insulator (GeOI). In this embodiment, the base 100 is monocrystalline silicon.

Figure 2:
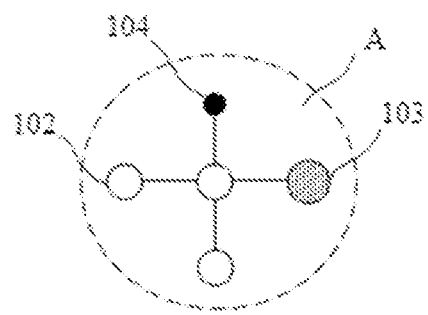
FIG. 2, FIG. 4, FIG. 6 and FIG. 8 are schematic diagrams of partial microstructures corresponding to various steps of a method of forming a film according to an embodiment of the present disclosure.

As shown in FIG. 1 and FIG. 2, in this embodiment, the DLC film 110 is formed by using a metal precursor and a carbon precursor as a reactant, such that the formed DLC film 110 is doped with metal elements, and the metal elements 103 include carbon-friendly metal elements such as a titanium element, a tungsten element, or a chromium element. The doped carbon-friendly metal elements form, with carbon elements, a carbide hard phase with a stable thermodynamic property, to enhance a mechanical property and wear resistance of the DLC film 110. In addition, the doped metal elements have carbon-friendly characteristics. This is beneficial to improving structural stability of the formed DLC film 110.

In another embodiment, the DLC film may be formed by using a carbon precursor and a doped gas as a reactant.

The metal elements exist in a form of a nanocrystal in the DLC film 110, or in a form of a nanocrystal that forms a face-centered cubic structure with carbon elements. The formed DLC film 110 has a stable thermodynamic property and a relatively strong mechanical property and wear resistance.

The metal elements 103 account for 5% to 25%, for example, 10%, 15%, or 20%, of the mass of the DLC film 110. Content of the metal elements 103 is kept within this range, to retain excellent properties of graphite to the maximum extent while improving physical properties, such as hardness and wear resistance, of the DLC film 110.

In this embodiment, the DLC film 110 is formed by using a plasma chemical vapor deposition process 101, which is beneficial to quickly forming the DLC film 110 in which different elements are uniformly distributed.

In another embodiment, a carbon-containing gas mixture may be provided above the base, and then a carbon-containing electrode disposed in a treatment chamber may be bombarded, to generate a secondary electron beam in the carbon-containing gas mixture, which in turn forms a DLC film on a surface of the base from elements of the gas mixture.

FIG. 2 is a schematic diagram of a microstructure of a region A in FIG. 1. Different elements in the DLC film 110 are uniformly arranged, and the elements in the DLC film 110 are described in detail by intercepting the region A as an example.

Referring to FIG. 2, in this embodiment, the DLC film 110 has carbon elements 102, metal elements 103, and hydrogen elements 104, where the hydrogen element 104 and the carbon element 102 form a carbon-hydrogen chemical bond, different carbon elements 102 form a carbon-carbon chemical bond, and the metal element 103 and the carbon element 102 form a carbon-metal element chemical bond.

Figure 3:
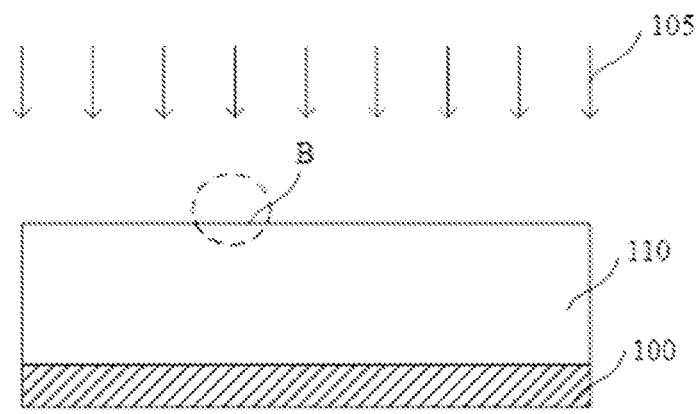

Referring to FIG. 3, photocatalytic treatment 105 is performed on the DLC film 110, to break at least some of carbon-hydrogen chemical bonds and reduce content of the hydrogen elements 104 (refer to FIG. 2) in the DLC film 110.

In an example, after the photocatalytic treatment 105 is performed, content of the carbon-hydrogen chemical bonds included in the DLC film 110 accounts for less than 5% of all chemical bonds. a proportion of the carbon-hydrogen chemical bonds is smaller, and proportions of carbon-carbon chemical bonds and carbon-metal element chemical bonds are greater. This is beneficial to improving hardness of the DLC film 110.

The photocatalytic treatment 105 breaks at least some of the carbon-hydrogen chemical bonds in the DLC film 110, and the hydrogen elements 104 escape as a gas is from the DLC film 110, to reduce content of the hydrogen elements 104 in the DLC film 110. Since the hydrogen elements 104 in the DLC film 110 are reduced, a proportion of carbon elements 102 in the DLC film 110 increases, and the carbon elements 102 with a higher proportion enables atomic arrangement in the DLC film 110 to be more regular, thereby improving the hardness of the DLC film 110 and improving performance of the DLC film 110.

In an example, process parameters of the photocatalytic treatment 105 include: a used light wavelength range of 200 nanometers to 400 nanometers, for example, 250 nanometers, 300 nanometers, or 350 nanometers, a process time length of 3 minutes to 8 minutes, for example, 4 minutes, 5 minutes, or 6 minutes, and a process temperature of 15 degrees Celsius to 60 degrees Celsius, for example, 30 degrees Celsius, 40 degrees Celsius, or 50 degrees Celsius. The photocatalytic treatment 105 is performed by using the process parameters, to provide sufficient energy to break the carbon-hydrogen chemical bonds, and ensure that the energy is not so large as to affect a structure of the DLC film 110.

Figure 4:
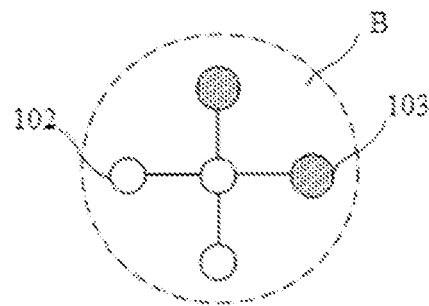

FIG. 4 is a schematic diagram of a microstructure of a region B in FIG. 3. Referring to FIG. 4, the broken carbon bond forms a carbon-metal element chemical bond with the metal element 103 after the carbon-hydrogen chemical bond is broken. A quantity of carbon-metal element chemical bonds in the DLC film 110 is increased. This is beneficial to improving physical properties, such as hardness and wear resistance, of the DLC film 110.

Figure 5:
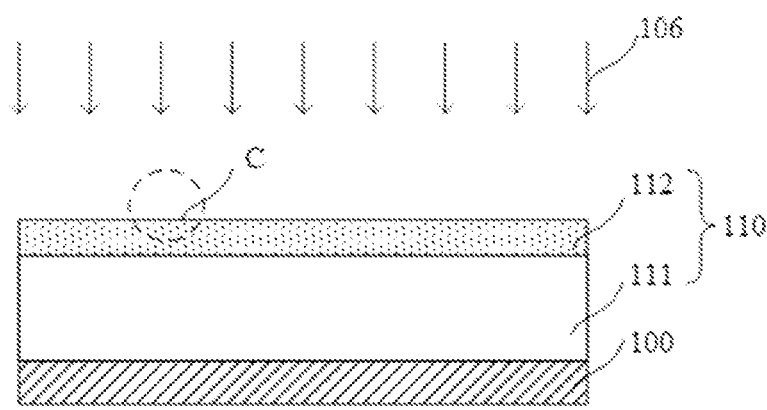
Figure 6:
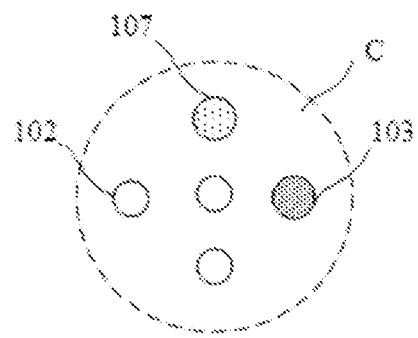

Referring to FIG. 5 and FIG. 6, after the photocatalytic treatment 105 is performed, the method may further include: performing ion implantation treatment 106 on the DLC film 110, where the ion implantation treatment 106 reduces content of Sp3 hybrid bonds in the DLC film 110, such that a density of carbon atoms in a partial region of the DLC film 110 is reduced.

The ion implantation treatment 106 is performed on the DLC film 110, to reduce the content of the Sp3 hybrid bonds in the DLC film 110, such that the density of the carbon atoms in the partial region of the DLC film 110 is reduced. That the density of the carbon atoms in the partial region of the DLC film 110 is reduced indicates that an average coordination number of atoms in part of the DLC film 110 is reduced, where the coordination number refers to a quantity of coordination atoms around an atom at a center of a chemical compound, such that an internal stress of the DLC film 110 is reduced. In addition, that the content of the Sp3 hybrid bonds in the DLC film 110 is reduced can improve toughness of the DLC film 110, and effectively enhance mechanical tribological adaptability of the DLC film 110 in vacuum and an atmospheric environment.

The ion implantation treatment 106 is to implant group V elements 107 into the DLC film 110. In this embodiment, the implanted group V element 107 is a nitrogen element. Raw materials of the nitrogen element come from a wide range of sources, including ammonia, nitrogen oxide, nitrogen, and the like. A price of the nitrogen element is inexpensive, and an exhaust gas generated after the implantation is harmless and easy to be processed. In another embodiment, group V elements such as a phosphorus element or an arsenic element may be implanted.

In this embodiment, energy provided by the ion implantation treatment 106 breaks a carbon-carbon chemical bond and a carbon-metal element chemical bond, to enable at least some of the carbon elements 102 to separate from the chemical bonds, and generate carbon free radicals, where the carbon free radicals and the group V elements 107 form Sp2 hybrid bonds.

The DLC film 110 is doped with nitrogen elements, and the nitrogen elements may reduce an internal stress of the DLC film 110 through crystalline grain dislocation slip strain, to improve toughness of the DLC film 110, and effectively enhance mechanical tribological adaptability of the DLC film 110 in vacuum and an atmospheric environment; the nitrogen elements suppress formation of the Sp3 hybrid bonds, leading to reduction of a density of carbon atoms in a partial region, and finally causing the Sp3 hybrid bonds to transform into Sp2 hybrid bonds; content of the Sp2 hybrid bonds in the DLC film 110 is increased, and content of the Sp3 hybrid bonds is reduced; compared with the Sp3 hybrid bond, the Sp2 hybrid bond has atoms with a smaller average coordination number, and an average coordination number of atoms in the entire DLC film 110 becomes smaller, such that the internal stress of the DLC film 110 is reduced.

Process parameters of the ion implantation treatment 106 include: implantation energy of 1 electron volt to 2 electron volts, for example, 1.2 electron volts, 1.4 electron volts, or 1.8 electron volts, an ion source implantation dose of 1011 ions per square centimeter to 1013 ions per square centimeter, and a process time length of 5 seconds to 200 seconds, for example, 20 seconds, 100 seconds, or 120 seconds.

In this embodiment, relatively low implantation energy and a relatively high implantation dose are used, to reduce damage to a surface of the DLC film 110 in the process of performing the ion implantation treatment 106, thereby increasing a product yield.

After the ion implantation treatment 106 is performed, part of the DLC film 110 is a first DLC film 112 including the group V elements 107, and the remaining part of the DLC film 110 serves as a second DLC film 111.

In a direction perpendicular to the surface of the DLC film 110, a thickness of the DLC film 110 is 150 nanometers to 170 nanometers, for example, 155 nanometers, 160 nanometers, or 165 nanometers. In the direction perpendicular to the surface of the DLC film 110, a thickness of the first DLC film 112 is 20 nanometers to 50 nanometers, for example, 25 nanometers, 20 nanometers, or 40 nanometers. In the direction perpendicular to the surface of the DLC film 110, a thickness of the second DLC film 111 is 100 nanometers to 150 nanometers, for example, 110 nanometers, 120 nanometers, or 130 nanometers.

FIG. 6 is a schematic structural diagram of a microstructure of a region C in FIG. 5. Referring to FIG. 6, after the ion implantation treatment 106 is performed, a lattice of the DLC film 110 is damaged, not only are some of the carbon elements 102 separated from chemical bonds to form carbon free radicals, but also some of the metal elements 103 and the group V elements 107 are separated from chemical bonds.

In another embodiment, the ion implantation treatment may alternatively not be performed on the DLC film.

Figure 7:
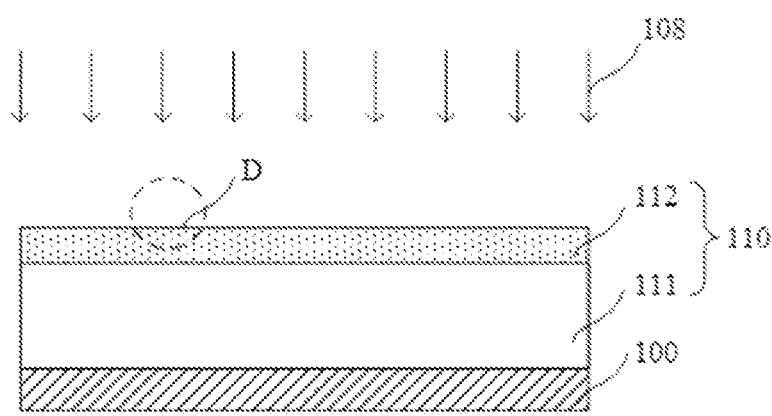

Referring to FIG. 7, after the ion implantation treatment 106 is performed (referring to FIG. 5), the method may further include: performing annealing treatment 108 on the DLC film 110, to repair of the lattice damage to the DLC film 110 in the process of the ion implantation treatment 106, where the metal elements and the group V elements also is diffuse in the process of the annealing treatment 108 and become part of the lattice of the DLC film 110.

In this embodiment, process parameters of the annealing treatment 108 include: a process temperature of 300 degrees Celsius to 500 degrees Celsius, for example, 350 degrees Celsius, 400 degrees Celsius, or 450 degrees Celsius, and a process time length of 20 minutes to 30 minutes, for example, 23 minutes, 25 minutes, or 28 minutes.

Figure 8:
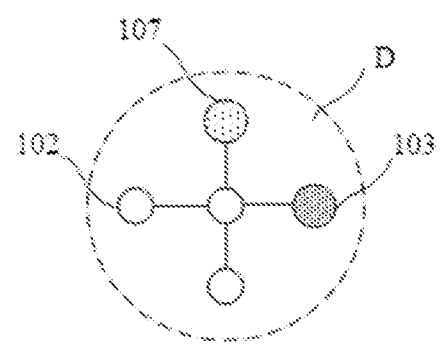

FIG. 8 is a schematic diagram of a microstructure of a region D of FIG. 7. Referring to FIG. 8, in the annealing treatment 108 (referring to FIG. 7), the metal elements 103 and the group V elements 107 diffuse in the DLC film 110, and are integrated into the repaired lattice of the DLC film 110, to form a DLC film 110 with a relatively small average coordination number.

According to the method of forming a film provided in this embodiment of the present disclosure, the photocatalytic treatment 105 is performed on the DLC film 110, to remove some of the hydrogen elements in the DLC film 110 and improve hardness of the DLC film 110; and then the ion implantation treatment 106 is performed on the DLC film 110, to reduce the content of the Sp3 hybrid bonds in the DLC film 110, such that a density of carbon atoms in a partial region of the DLC film 110 is reduced, and an internal stress of the DLC film 110 is reduced. When the DLC film 110 is used in a semiconductor patterning process, the DLC film 110 with a relatively low internal stress has a good pattern transfer effect and can effectively avoid warpage of a wafer.

A second embodiment of the present disclosure provides a film, where the film may be formed according to the method of forming a film in the first embodiment. The film provided in the second embodiment of the present disclosure is described in detail below with reference to the accompanying drawings.

Referring to FIG. 7, the film provided in this embodiment includes: the DLC film 110 obtained after the photocatalytic treatment is performed.

In this embodiment, the DLC film 110 has carbon elements, metal elements, and hydrogen elements, where the hydrogen element and the carbon element form a carbon-hydrogen chemical bond, different carbon elements form a carbon-carbon chemical bond, and the metal element and the carbon element form a carbon-metal element chemical is bond.

Content of the hydrogen elements in the DLC film 110 is fewer, and content of carbon-hydrogen chemical bonds included in the DLC film 110 accounts for less than 5% of all chemical bonds; the hydrogen elements 104 in the DLC film 110 are fewer, and a proportion of carbon elements in the DLC film 110 is higher, where the carbon elements with a higher proportion cause atomic arrangement in the DLC film 110 to be more regular, such that hardness of the DLC film 110 is improved, thereby improving performance of the DLC film 110.

In this embodiment, the metal elements include carbon-friendly metal elements such as a titanium element, a tungsten element, or a chromium element. The doped carbon-friendly metal elements form, with the carbon elements, a carbide hard phase with a stable thermodynamic property, to enhance a mechanical property and wear resistance of the DLC film 110. In addition, the doped metal elements have carbon-friendly characteristics. This is beneficial to improving structural stability of the formed DLC film 110.

The metal elements exist in a form of a nanocrystal in the DLC film 110, or in a form of a nanocrystal that forms a face-centered cubic structure with carbon elements. The formed DLC film 110 has a stable thermodynamic property and a relatively strong mechanical property and wear resistance.

The metal elements account for 5% to 25%, for example, 10%, 15%, or 20%, of the mass of the DLC film 110. Content of the metal elements is kept within this range, to retain excellent properties of graphite to the maximum extent while improving physical properties, such as hardness and wear resistance, of the DLC film 110.

In this embodiment, part of the DLC film 110 is a first DLC film 112 including group V elements, and the remaining part of the DLC film 110 serves as a second DLC film 111.

In this embodiment, the group V element is a nitrogen element. Raw materials of the nitrogen element come from a wide range of sources, including ammonia, nitrogen oxide, nitrogen, and the like. A price of the nitrogen element is inexpensive, and an exhaust gas generated after the implantation is harmless and easy to be processed. In another embodiment, group V elements such as a phosphorus element or an arsenic element may be implanted.

The DLC film 110 is doped with nitrogen elements, and the nitrogen elements may reduce an internal stress of the DLC film 110 through crystalline grain dislocation slip strain, to improve toughness of the DLC film 110, and effectively enhance mechanical tribological adaptability of the DLC film 110 in vacuum and an atmospheric environment; the nitrogen elements suppress formation of the Sp3 hybrid bonds, leading to reduction of a density of carbon atoms in a partial region, and finally causing the Sp3 hybrid bonds to transform into Sp2 hybrid bonds; content of the Sp2 hybrid bonds in the DLC film 110 is increased, and content of the Sp3 hybrid bonds is reduced; compared with the Sp3 hybrid bond, the Sp2 hybrid bond has atoms with a smaller average coordination number, and an average coordination number of atoms in the entire DLC film 110 becomes smaller, such that the internal stress of the DLC film 110 is reduced.

In a direction perpendicular to the surface of the DLC film 110, a thickness of the DLC film 110 is 150 nanometers to 170 nanometers, for example, 155 nanometers, 160 nanometers, or 165 nanometers. In the direction perpendicular to the surface of the DLC film 110, a thickness of the first DLC film 112 is 20 nanometers to 50 nanometers, for example, 25 nanometers, 20 nanometers, or 40 nanometers. In the direction perpendicular to the surface of the DLC film 110, a thickness of the second DLC film 111 is 100 nanometers to 150 nanometers, for example, 110 nanometers, 120 nanometers, or 130 nanometers.

Embodiments of the present disclosure provide a film, the content of the carbon-hydrogen chemical bonds included in the DLC film 110 accounts for less than 5% of all chemical bonds, the hydrogen elements 104 in the DLC film 110 are fewer, a proportion of carbon elements in the DLC film 110 is higher, and the carbon elements with a higher proportion cause atomic arrangement in the DLC film 110 to be more regular, such that hardness of the DLC film 110 is relatively high; part of the DLC film 110 is a first DLC film 112 including the group V elements, and because the DLC film 110 has the group V elements, the DLC film 110 has more Sp2 hybrid bonds, and the density of carbon atoms in a partial region of the DLC film 110 is relatively low; the relatively low density of carbon atoms in the partial region of the DLC film 110 indicates that an average coordination number of atoms in the DLC film 110 is relatively small, to form the DLC film 110 with a relatively low internal stress; in addition, the DLC film 110 with a relatively low internal stress has relatively high toughness, and has relatively good mechanical tribological adaptability in vacuum and an atmospheric environment.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

Embodiments of the present disclosure provide a film and a forming method thereof, to help improve hardness of a DLC film and reduce an internal stress of the DLC film.

The invention claimed is:

1. A method of forming a film, comprising:
providing a base;
forming a diamond-like carbon film on the base, wherein the diamond-like carbon film has a carbon-hydrogen chemical bond; and
performing photocatalytic treatment on the diamond-like carbon film, to break at least some of the carbon-hydrogen chemical bonds and reduce content of hydrogen elements in the diamond-like carbon film; and,
wherein the process parameters of the photocatalytic treatment comprise: a light wavelength range of 200 nanometers to 400 nanometers, a process time length of 3 minutes to 8 minutes, and a process temperature of 15 degree Celsius to 60 degree Celsius.

2. The method of forming the film according to claim 1, wherein the forming a diamond-like carbon film on the base comprises:
    forming the diamond-like carbon film on the base by using a metal precursor and a carbon precursor, such that the diamond-like carbon film is doped with metal elements.

3. The method of forming the film according to claim 2, wherein
    the diamond-like carbon film is formed by a plasma chemical vapor deposition process, and
    the metal elements exist in a form of a nanocrystal in the diamond-like carbon film, or in a form of a nanocrystal that forms a face-centered cubic structure with carbon elements.

4. The method of forming the film according to claim 3, wherein the metal elements account for 5% to 25% of the mass of the diamond-like carbon film.

5. The method of forming the film according to claim 3, wherein the metal elements comprise: a titanium element, a tungsten element, or a chromium element.

6. The method of forming the film according to claim 1, wherein after the performing photocatalytic treatment, the method further comprises:
    performing ion implantation treatment on the diamond-like carbon film, to reduce content of Sp3 hybrid bonds in the diamond-like carbon film, such that a density of carbon atoms in a partial region of the diamond-like carbon film is reduced.

7. The method of forming the film according to claim 6, wherein the ion implantation treatment is further adapted to enabling at least some of the carbon elements to separate from chemical bonds, to generate carbon free radicals.

8. The method of forming the film according to claim 7, wherein group V elements are implanted for the ion implantation treatment, and the carbon free radicals and the group V elements form Sp2 hybrid bonds.

9. The method of forming the film according to claim 8, wherein after the ion implantation treatment is performed, part of the diamond-like carbon film is a first diamond-like carbon film comprising the group V elements.

10. The method of forming the film according to claim 9, wherein in a direction perpendicular to an upper surface of the diamond-like carbon film, a thickness of the first diamond-like carbon film is 20 nanometers to 50 nanometers.

11. The method of forming the film according to claim 10, wherein in the direction perpendicular to the upper surface of the diamond-like carbon film, a thickness of the diamond-like carbon film is 150 nanometers to 170 nanometers.

12. The method of forming the film according to claim 6, wherein process parameters of the ion implantation treatment comprise: implantation energy of 1 electron volt to 2 electron volts, an ion source implantation dose of 1011 ions per square centimeter to 1013 ions per square centimeter, and a process time length of 5 seconds to 200 seconds.

13. The method of forming the film according to claim 6, wherein after the performing ion implantation treatment, the method further comprises: performing annealing treatment on the diamond-like carbon film.

14. The method of forming the film according to claim 13, wherein process parameters of the annealing treatment comprise: a process temperature of 300 degrees Celsius to 500 degrees Celsius, and a process time length of 20 minutes to 30 minutes.

15. The method of forming the film according to claim 3, wherein after the performing photocatalytic treatment, the method further comprises:
    performing ion implantation treatment on the diamond-like carbon film, to reduce content of Sp3 hybrid bonds in the diamond-like carbon film, such that a density of carbon atoms in a partial region of the diamond-like carbon film is reduced.

* * * * *